United States Patent [19]
Okamoto et al.

[11] Patent Number: 5,258,705
[45] Date of Patent: Nov. 2, 1993

[54] ACTIVE MATRIX SUBSTRATE INSPECTING DEVICE

[75] Inventors: Masaya Okamoto, Nara; Fumiaki Funada, Yamatokoriyama; Shoji Yoshii, Nara, all of Japan

[73] Assignee: Sharp Kabushiki Kaisha, Osaka, Japan

[21] Appl. No.: 809,910

[22] Filed: Dec. 19, 1991

[30] Foreign Application Priority Data

| Dec. 21, 1990 | [JP] | Japan | 2-405237 |
| Feb. 28, 1991 | [JP] | Japan | 3-34176 |
| Apr. 19, 1991 | [JP] | Japan | 3-88089 |

[51] Int. Cl.$^5$ ............ G01R 31/02; G02F 1/135
[52] U.S. Cl. .................... 324/158 R; 359/72
[58] Field of Search ........ 324/158 R, 158 D; 359/72, 74, 84, 51, 52; 340/765, 784

[56] References Cited

U.S. PATENT DOCUMENTS 4,355,278 10/1982 Burns et al. .......... 324/158
4,538,884 9/1985 Masaki .................. 359/72

FOREIGN PATENT DOCUMENTS 3920495 10/1990 Fed. Rep. of Germany .
0010720 1/1983 Japan ..................... 359/72

OTHER PUBLICATIONS

Item 28p-ZD-6; Applied Physics Society; 1989 Autumn; p. 4.
IBM Technical Disclosure Bulletin, vol. 33, No. 2, Jul. 1990 pp. 130-131, "Liquid Crystal-Based Test Head".
Electronic Design, vol. 19, Sep. 13, 1967, pp. 71-79, Lauriente et al, "Liquid Crystals Plot The Hot Spots".
Patent Abstracts Of Japan, vol. 14, No. 98 (P-1011)22, Feb. 1990 JP-A-1 303 485 (Sharp), Dec. 7, 1989.

*Primary Examiner*—Ernest F. Karlsen
*Attorney, Agent, or Firm*—Nixon & Vanderhye

[57] ABSTRACT

A device and method for inspecting any fault in an active matrix substrate which includes a transparent conductive film on the substrate, an orientation film on the transparent conductive film, a polymer sheet opposite the orientation film with a liquid crystal sandwiched therebetween, a spacer for maintaining a space between the orientation film and the polymer sheet. An electrical modulation is observed in the liquid crystal by applying a voltage across the pixel electrode and the transparent conductive film.

20 Claims, 6 Drawing Sheets

ACTIVE MATRIX SUBSTRATE INSPECTING DEVICE

BACKGROUND OF THE INVENTION

1. Field of the Invention

The present invention relates to an active matrix substrate inspecting device for uncovering faults in an active matrix substrate and a method of inspecting an active matrix substrate for the presence of a fault.

2. Description of the Prior Art

A liquid crystal display device of an active matrix system includes an active matrix substrate which comprises pixel electrodes disposed on an insulating substrate in a matrix and driving elements such as a thin film transistor (hereinafter referred to as "TFT") connected to each pixel electrode. The driving element includes a two-terminal element, a three-terminal element, or the like.

As an example of the two-terminal element an equivalent circuit such as a diode ring, a back-to-diode, and a metal-insulating layer-metal (MTM) is shown in FIG. 8. This active matrix display includes a plurality of signal lines 31 and a plurality of signal scanning lines 35 crossing the signal lines 31. In each area which is encompassed by the scanning line 35 and the signal line 31, a two-terminal element 32 and a pixel capacitance 37 are disposed. This active matrix display device is so constructed that a liquid crystal layer 34 (FIG. 8) is interposed between an active matrix substrate shown in FIG. 9A and a counter substrate shown in FIG. 9B. In the active matrix substrate shown in FIG. 9A, the signal line 31 and a two-terminal element 32 are provided. One terminal of the two-terminal element 32 is connected to the signal line 31, and the other terminal thereof is connected to the pixel capacitance 37 which has a pixel electrode 33 on the active matrix substrate (FIG. 9A), a counter electrode 36 on the counter substrate (FIG. 9B), and the liquid crystal layer 34 sandwiched therebetween. The pixel capacitance 37 stores electric charge, thereby modulating the optical characteristic of the pixel electrodes.

Another example using a three-terminal element is shown in the form of an equivalent circuit using TFTs in FIG. 10. This display device consists of an active matrix substrate 45 shown in FIG. 11, a counter substrate (not shown) formed of a transparent conductive layer on the entire surface of an insulating substrate, and a liquid crystal layer 34 sandwiched between the active matrix substrate 45 and the counter electrode. Likewise, the scanning lines 35 and the signal lines 31 cross each other in an insulated state on the active matrix substrate 45. A gate electrode 41 of the TFT 40 is connected to the scanning line 35. The source electrode 42 of the TFT 40 is connected to the signal line 31. The pixel electrode 33 is connected to a drain electrode 43 of the TFT 40.

This display device is operated in the following manner:

Initially, a single scanning line is selected from the scanning lines 35. Then, an on-voltage is applied to the gate electrode 41, thereby outputting video signals simultaneously or sequentially to a plurality of the signal lines 31. The output signals are stored in the pixel capacitance 37 via the source electrode 42 and the drain electrode 43 of the TFT 40. The video signals stored in the pixel capacitance 37 is held during a one-frame period till the next on-voltage is applied after the voltage of the scanning line 35 is off. The voltage in the form of video signals changes the orientation of molecules of the liquid crystal layer 34 in the pixel capacitance 37 and performs a display. To enhance the holding characteristic of the video signal, an additional capacitance is often provided in parallel with the pixel capacitance 37. In addition, in the case of color display, a color filter is provided to each pixel.

An active matrix substrate of the active matrix display device is liable to fault during the production process because numberless driving elements and pixel electrodes are formed on the active matrix substrate. In general, two types of faults occur in the active matrix substrate; that is, a linear fault and a dot fault. Some linear faults are caused by the breakage of the scanning line 35 or the signal line 31, a leakage occurring on the scanning line 35 or the signal line 31, and the leakage between the scanning line 35 and the signal line 31. Dot faults are caused by non-activation of on-state or off-state of the active element and a leakage occurring between the pixel electrode 33, the scanning line 35, and the signal line 31.

Inspection for these faults must be made during the production process. Inspection for a linear fault can be made when an active matrix substrate is produced. More specifically, any linear fault is inspected by a short-circuit check between the scanning lines 35, between the signal lines 31, and between the scanning line 35 and the signal line 31.

In the case of TFTs in an active matrix substrate, faults are detected by using probes which are stuck in the pixel electrodes 33 and applying voltage to the scanning line 35 and the signal line 31. This inspecting method, disadvantageously, takes time. In addition, the active matrix substrate is likely to be damaged by the probes. This inspecting method cannot be applied to all pixels.

As described above, the known fault inspecting method is performed on an assembled display device because of the ease and accuracy for finding faults as compared with when it is performed on the active matrix substrate in a disassembled state. If the fault inspection is performed on the active matrix substrate, cost expenditure will be reduced on material such as an orientation film, liquid crystal, a counter substrate, and a color filter on the counter substrate. However, as described above, the active matrix substrate of the above-mentioned structure does not allow a fault inspection to be conducted directly on the active matrix substrate.

SUMMARY OF THE INVENTION

The active matrix substrate inspecting device of this invention, which overcomes the above-discussed and numerous other disadvantages and deficiencies of the prior art, comprises a transparent insulating substrate; a transparent conductive film on the substrate; an orientation film on the transparent conductive film; a polymer sheet disposed opposite the orientation film with a liquid crystal layer sandwiched therebetween; and a spacer for maintaining a space between the orientation film and the polymer sheet.

Alternatively, the active matrix substrate inspecting device comprises a transparent conductive film formed on a transparent insulating substrate; a polymer dispersion-type liquid crystal layer formed on the conductive film; and a polymer sheet formed on the liquid crystal layer.

In a preferred embodiment, the polymer sheet is photoconductive.

According to another aspect of the present invention, there is provided a method for inspecting any fault in an active matrix substrate, which comprises the steps of disposing an inspecting active matrix substrate opposite a polymer sheet of an inspecting device, applying a voltage across a pixel on the active matrix substrate and a transparent conductive film formed on the active matrix substrate, and inspecting electrical modulation occurring in the liquid crystal layer.

Alternatively, the method for inspecting an active matrix substrate for any fault, comprises the steps of disposing an active matrix substrate opposite a photoconductive polymer sheet of an inspecting device, applying a voltage across a pixel electrode on the active matrix substrate and a transparent conductive film formed on the active matrix substrate, and inspecting electrical modulation occurring in the liquid crystal layer.

In a preferred embodiment, the polymer sheet becomes electroconductive by exposure to visible light irradiation.

Alternatively, the method for inspecting an fault in an active matrix substrate by use of any active matrix substrate inspecting device including a transparent conductive film on a transparent insulating substrate, a polymer dispersion-type liquid crystal on the conductive film, and a polymer sheet on the liquid crystal layer, the method comprises the steps of disposing the active matrix substrate inspecting device such that the liquid crystal thereof is located opposite an active matrix element formed thereon; applying a voltage across a pixel electrode formed on the active matrix substrate and the conductive film of the active matrix substrate inspecting device; and inspecting the rate of change of optical characteristics in the liquid crystal layer of the active matrix substrate inspecting device.

In a preferred embodiment, the polymer sheet of the active matrix substrate inspecting device becomes photoconductive by exposure to visible light irradiation.

Thus, the invention described herein makes possible the objectives of (1) providing an active matrix substrate inspecting device which can easily find a fault in the pixels on an active matrix substrate before the display panel is assembled, and (2) providing a method for inspecting an active matrix substrate for any fault before the display panel is assembled.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Example 1

Figure 2A:
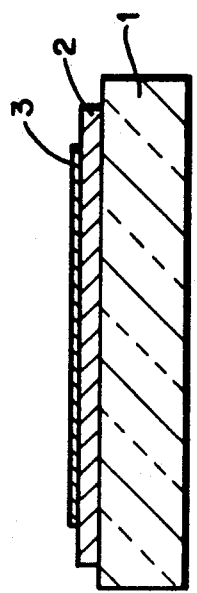
FIGS. 2A, 2B and 2C are diagrammatic views showing a production process for the active matrix substrate inspecting device of FIG. 1.
Figure 2B:
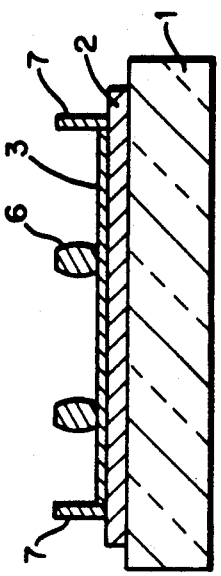
Figure 2C:
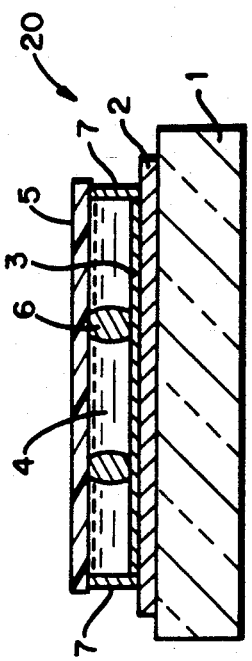

Referring to FIGS. 2A, 2B, and 2C, the illustrated active matrix substrate inspecting device 20 of the present invention includes a transparent insulating substrate 1, a transparent conductive film 2 formed on the substrate 1, an orientation film 3 formed on the transparent conductive film 2, a polymer sheet 5 facing the orientation film 3 with the liquid crystal 4 interposed therebetween, and a spacer 6 disposed to keep the thickness of the liquid crystal 4 constant. The illustrated active matrix substrate inspecting device will be described according to the fabricating process. First, the transparent conductive film 2 is formed on the transparent insulating substrate 1 made of glass or any other transparent material. The transparent conductive film 2 consists of indium oxide, tin oxide, indium tin oxide or the like. In the case of producing an inspecting device for an active matrix substrate having a two-terminal element, the transparent conductive film 2 is patterned to the same width as that of the pixel electrode on the active matrix substrate to be tested and in the same direction as the scanning lines. In the case of producing the inspecting device for an active matrix substrate having a three-terminal element, the transparent conductive film 2 is formed on the whole surface of the substrate 1.

The orientation film 3 is formed on the transparent conductive film 2 to orientate liquid crystal molecules. The orientation film 3 is formed by rubbing a film consisting of polymide-base resin, polyvinylalcohol-base resin, $SiO_2$, or the like; alternatively, by vapor-depositing oxides such as silicon oxide, fluoride, metals such as Au and Al, and oxides thereof. The spacers 6 are placed on the orientation film 3 so as to keep the thickness of the liquid crystal layer 4 constant. Then, a sealant 7 is formed around a region in which the liquid crystal is confined.

An extended polymer sheet 5 is placed over the substrate 1 on which the sealant 7 is formed. The polymer sheet 5 is obtained by extending a high-polymer film such as polycarbonate, polyester, and acrylics. The thickness of the polymer sheet 5 is preferably in the range from 1.0 μm to 100 μm. If the thickness of the polymer sheet 5 is less than 1.0 μm, the strength thereof is decreased. If it is more than 100 μm, a sufficient voltage cannot be applied to the liquid crystal layer. The liquid crystal layer 4 is enclosed between the orientation film 3 and the polymer sheet 5. The liquid crystal layer 4 is formed by mounting sufficient liquid crystal on a transparent conductive substrate and then placing the polymer sheet 5 on the spacer 6. Alternatively, it is possible that the sealant 7 is provided with an inlet through which liquid crystal is poured into the sealant 7 and the inlet is closed by the polymer sheet 5 in a vacuum. In this way, the active matrix substrate inspecting device 20 is obtained.

The mode of the active matrix substrate inspecting device 20 is preferably the same as that of the display device to be tested. In the illustrated embodiment, a twisted nematic liquid crystal for all purposes is used. The twisted nematic (TN) mode is employed in which the angle of twist determined by the rubbing direction to the orientation film 3 and the extending direction of the polymer sheet 5 display device is 90°. In this example, the inspecting device 20 is in the TN mode since the liquid crystal display device using the active matrix substrate to be tested is normally in the TN mode. It is possible to inspect against a raised contrast by taking advantage of a larger twisted angle in a super twisted nematic mode (STN).

Figure 1:
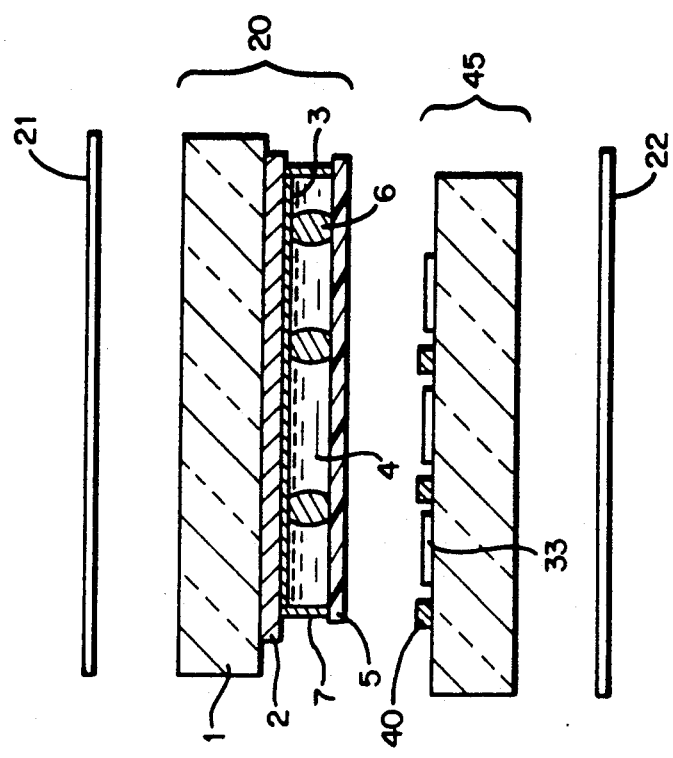
FIG. 1 is a diagrammatic view showing an active matrix substrate inspecting method using an active matrix substrate fault inspecting device of the present invention.
Figure 7:
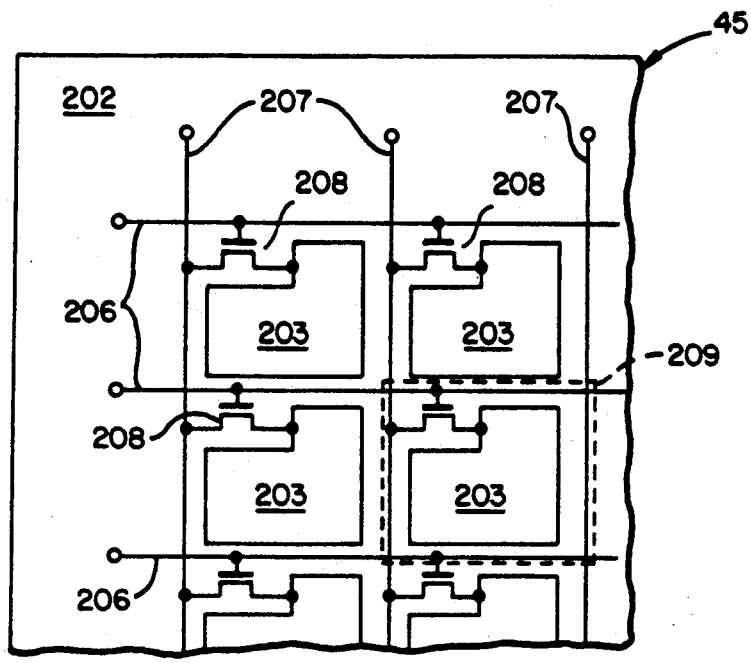
FIG. 7 is an equivalent circuit diagram of an active matrix display device using a three-terminal element.
Figure 8:
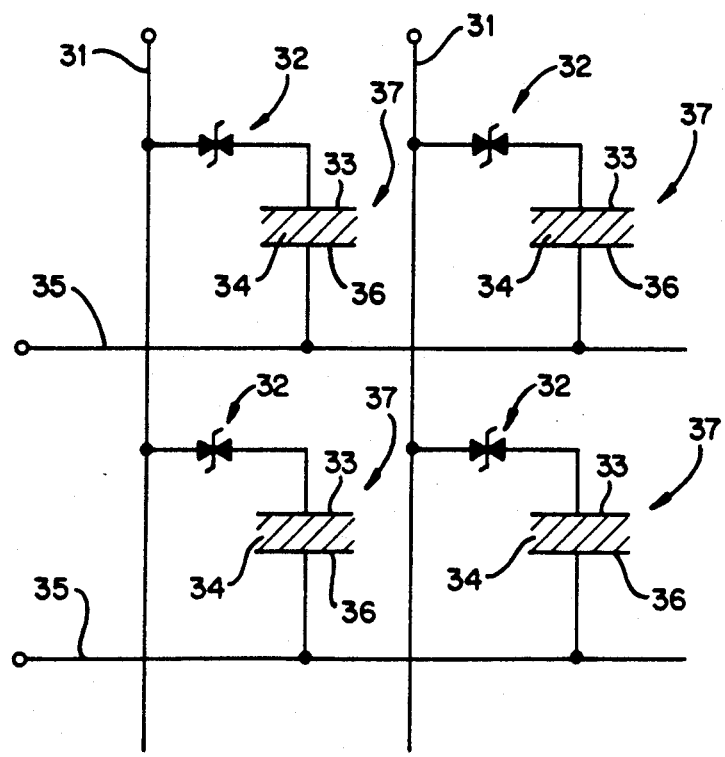
FIG. 8 is an equivalent circuit diagram of an active matrix display device using a two-terminal element.
Figure 9A:
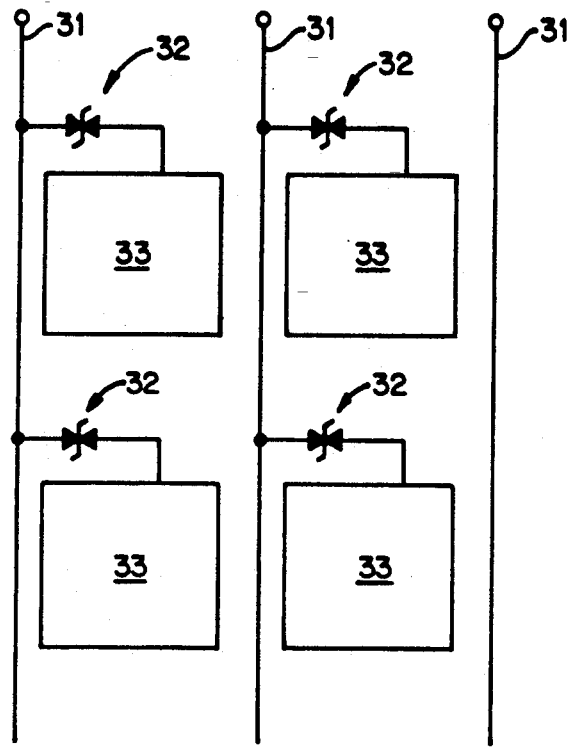
FIG. 9A is an equivalent circuit diagram of the active matrix substrate of the display device of FIG. 8.
Figure 9B:
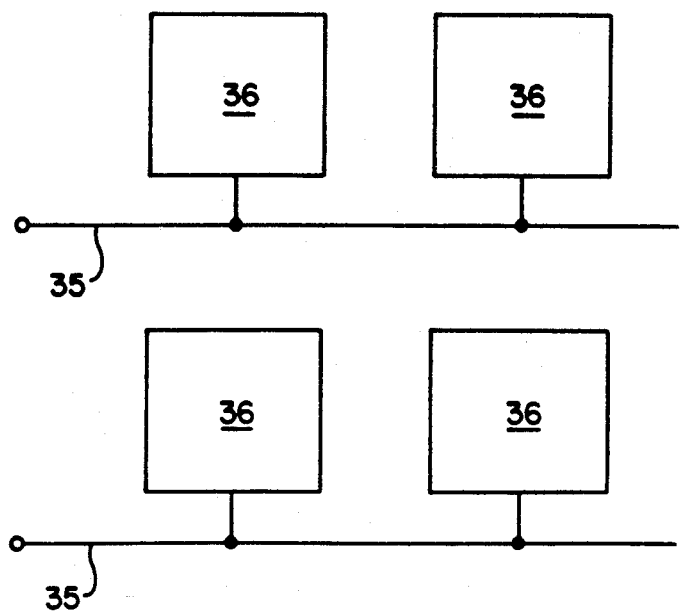
FIG. 9B is an equivalent circuit diagram of a counter substrate of the display device of FIG. 8.
Figure 10:
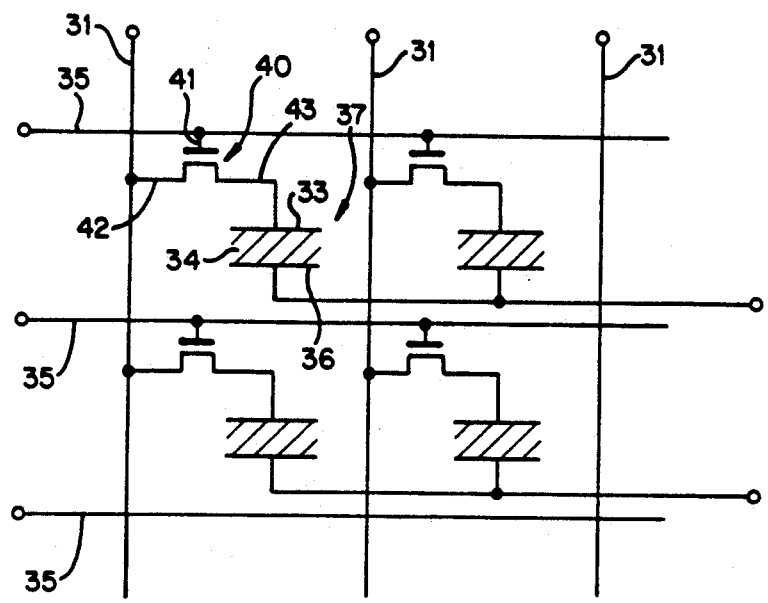
FIG. 10 is an equivalent circuit diagram of an active matrix display device using a three-terminal element.

An example of the method for inspecting an active matrix substrate with use of the active matrix substrate inspecting device 20 will be described with reference to FIG. 1:

As shown in FIG. 1, an active matrix substrate 45 is disposed opposite to the polymer sheet 5 of the active matrix substrate inspecting device. The active matrix substrate 45 shown in FIG. 7 is used. The polymer sheet 5 of the inspecting device 20 can be kept in contact with the active matrix substrate 45 or have a predetermined distance from the active matrix substrate 45 which is less than 100 μm. If the distance is more than 100 μm, a sufficient voltage cannot be applied to the liquid crystal layer. Polarization elements 21 and 22 are provided on the outer surface of the inspecting device 20 and the active matrix substrate 45. Instead of the polarization elements 21 and 22, polarization plates maybe used. The polarization elements 21 and 22 are disposed such that the polarizing axes are 90° or 0° to each other.

The inspecting device 20 has the active matrix substrate 45, and the polarization elements 21 and 22 arranged in the same manner as the actual liquid crystal display device. More specifically, the insulating substrate 1 of the inspecting device 20, the transparent conductive film 2, and the orientation film 3 are respectively counterparts of the insulating substrate, the counter electrode, and the orientation film on the counter substrate. The liquid crystal layer 4 functions in the same manner as the liquid crystal of the liquid crystal display device does.

Figure 3A:
FIGS. 3A, 3B and 3C are diagrammatic views showing the mode of simulating signals utilized for performing the active matrix substrate inspecting method of FIG. 1.
Figure 3B:
Figure 3C:
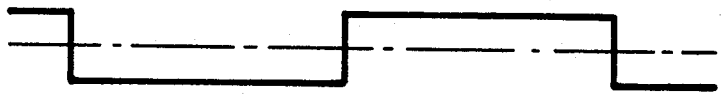

Under this arrangement, when a simulating signal voltage imitating an actual drive signal is applied to the scanning line 35, the signal line 31 on the active matrix substrate 45, and the transparent conductive film 2 of the inspecting device 20, the active matrix substrate 45 can be inspected for any fault as if it were actually displaying in the display panel. One example of the simulating signals is shown in FIGS. 3A to 3C. FIG. 3A shows a simulating scanning voltage applied to the scanning line 35 on the active matrix substrate 45. FIG. 3B shows a simulating signal voltage applied to the signal line 31. FIG. 3C shows a voltage applied to the transparent conductive film 2.

When a simulating signal as shown in FIGS. 3A to 3C is output to the scanning line 35, the signal line 31, and the transparent conductive film 2, normal pixel electrode 33 stores electrical charge through the on-state TFT 40, and continue to hold the electric charge after the TFT 40 is off. There are relationships among the following potential differences and capacitances, that is, the potential difference $V_{LC}$ between the orientation film 3 and the polymer sheet 5, the potential difference $V$ between the pixel electrode 33 and the transparent conductive film 2, the capacitance $C_{MA}$ of the orientation film 3, the capacitance $C_{LC}$ of the liquid crystal layer 4, the capacitance $C_{PS}$ of the polymer sheet 5, and the capacitance $C_{AIR}$ of the air gap between the polymer sheet 5 and the active matrix substrate 45.

$$V_{LC} = \frac{V}{C_{LC}((1/C_{MA}) + (1/C_{PS}) + (1/C_{AIR})) + 1} \quad (1)$$

This potential difference $V_{LC}$ changes the orientation of liquid crystal molecules, and when the normal pixel electrodes 33 are without fault, there is no problem in the display effected by them. If, however, the pixel electrodes have any faults such as a breakage and/or a leakage of the scanning lines 35 or the signal lines 31, a faulty TFT 40, and/or a leakage of the pixel electrodes 33, these faults can be readily found through a visual check or a CCD camera.

EXAMPLE 2

This embodiment is to prevent the fault inspection ability from being reduced in accordance with variations in the voltage applied to the pixel electrodes and the transparent electrodes. The applied voltage is distributed among the layers. As a result, the amplitude of changes in the voltage applied to the liquid crystal becomes smaller than that of changes in the voltage applied to the pixel electrodes and the transparent electrodes.

Specifically, the polymer sheet 5 is made from a photoconductive polymer sheet as shown in FIG. 2C which is obtained by extending a photoconductive high molecular compound which consists of an aromatic heterocyclic compound such as carbazole, with the addition of polycyclic aromatic hydrocarbon such as anthracene, or a photoconductive radical such as arilamine at the side chain or the principal chain of the macromolecule such as polyvinylcarbazole. It is preferable that the thickness of the photoconductive polymer sheet 5 is within the range from 1.0 μm to 100 μm. If the thickness of the photoconductive polymer sheet 5 is less than 1.0 μm, the strength of the polymer sheet 5 is decreased. If the thickness is more than 100 μm, the optical transmissibility becomes unsuitable for the fault inspection.

The polarization elements 21 and 22 are disposed such that the polarizing axes thereof are 90° to each other. In this example, the polarization elements 21 and 22 can be replaced by polarization plates.

Under this arrangement, when the active matrix substrate 45 is irradiated with light from the light source (not shown) through the polarization element 22, most of the light does not pass through the scanning lines 35 and the signal lines 31 and does not reach the photoconductive polymer sheet 5, and only a part of it reaches the polymer sheet 5 through a rectangular region enclosed by the scanning lines 35 and the signal lines 31. As a result, it is only this part of the polymer sheet 5 corresponding to the rectangular region that becomes conductive.

Under this arrangement, when a simulating signal voltage imitating a driving signal as shown in FIGS. 3A to 3C is applied to the scanning line 35, the signal line 31, and the transparent conductive film 2, the active matrix substrate 45 is inspected for any fault as if it were actually displaying in the display panel. In inspecting for a fault, if the simulating signal is applied to the scanning line 35, the signal line 31, and the transparent conductive film 2, normal pixel electrodes store electric charge and normally function through the on-state TFTs 40. The pixel electrodes continue to hold the electric charge after the TFTs 40 are off. The potential difference $V_{LC}$ between the potential difference on the orientation film 3 and the potential difference on the photoconductive polymer sheet 5 is represented by the following equation, where V is the potential difference between the pixel electrode 33 and the transparent conductive film 2, and $C_{MA}$, $C_{LC}$, and $C_{AIR}$ are respectively the capacitance of the orientation film 3, the capacitance of the liquid crystal layer 4, and the capacitance of the air gap between the polymer sheet 5 and the active matrix substrate 45:

$$V_{LC} = \frac{V}{C_{LC}((1/C_{MA}) + (1/C_{AIR})) + 1} \quad (2)$$

This potential difference changes the orientation of liquid crystal molecules, and if the pixel electrodes 33 have no fault, there is no problem in the display achieved by the pixel electrodes 33. If, however, the pixel electrodes have any fault such as a breakage and/or leakage between the scanning lines 35 and/or the signal lines 31, or a faulty TFT 40, these faults can be readily detected through a visual check or a CCD camera.

This example has demonstrated that no voltage drop occurs because the photoconductive polymer sheet 5 becomes electroconductive by irradiation with light from the light source (not shown). When a non-conductive polymer sheet is used, voltage drop occurs owing to the limited capacity of the polymer sheet 5, thereby resulting in a small value of $V_{LC}$ in the equation (1). Advantageously, this Example allows the voltage $V_{LC}$ applied to the liquid crystal layer 4 to be stepped up so as to have good contrast of the difference in the optical modulation of crystal liquid layer 4 between a normal pixel electrode and a faulty pixel electrode.

Example 3

Figure 5:
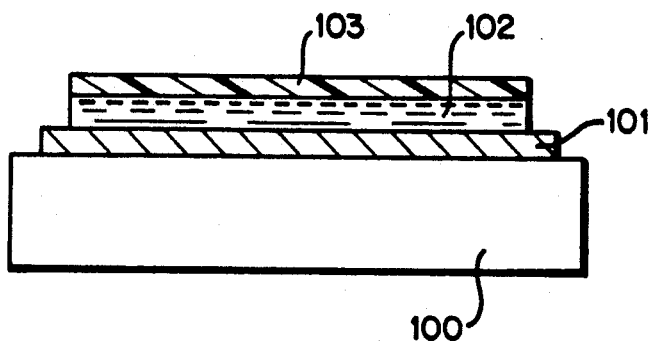
FIG. 5 is a front view showing an active matrix substrate inspecting device of FIG. 4.

Referring to FIGS. 5 and 6A to 6C, a further example will be described with respect to the structure and the fabricating process:

As shown in FIG. 5, the illustrated inspecting device 20 comprises a transparent conductive substrate 100, a transparent conductive film 101, liquid crystal layers 102 and polymer sheet 103. This inspecting device is fabricated as follows:

The transparent conductive film 101 is formed by depositing indium oxide, tin oxide, tin or the like on the transparent insulating substrate 100. When a two-terminal element is used, the transparent conductive film 101 is patterned to form scanning lines as active elements. When a three-terminal element is used, the transparent conductive film 101 can be formed on the entire surface of the substrate 100.

Figure 6A:
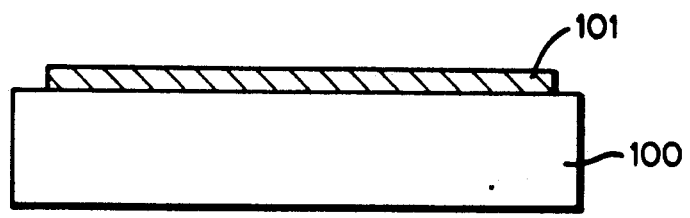
FIGS. 6A, 6B and 6C are diagrammatic views showing the production process of the active matrix substrate inspecting device of FIG. 5.
Figure 6B:
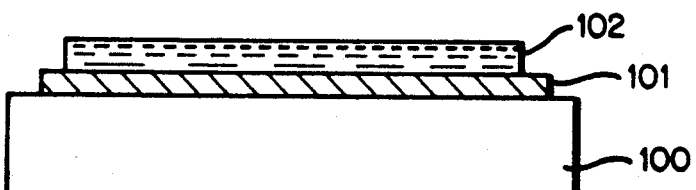
Figure 6C:
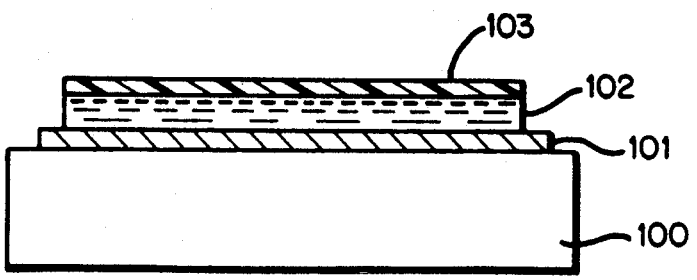

Then, the liquid crystal layer 102 consisting of a high-polymer dispersion-type liquid crystal is formed on the conductive film 101 as shown in FIG. 6B. The liquid crystal layer 102 is formed by a method in which a mixture of a solution such as a chloroform solution, transparent resin such as polymethacrylate (PMMA) and liquid crystal is applied to the substrate, and then baked. Alternatively, a mixture of UV polymeric compound such as bifunctional acrylate and liquid crystal is applied to the substrate, and solidified by UV light. Then, the polymer sheet 103 is, as shown in FIG. 6C, formed to the thickness of 1.0 $\mu$m to 100 $\mu$m as desired on the liquid crystal layer 102. This polymer sheet 103 is formed by spin coating, by baking or by adhering a film consisting of high-polymer compound, such as polycarbonate, polyester, or acrylics, to the liquid crystal layer 102. When a UV polymeric compound is used, the resulting polymer sheet 103 can be solidified by irradiation by light.

Figure 4:
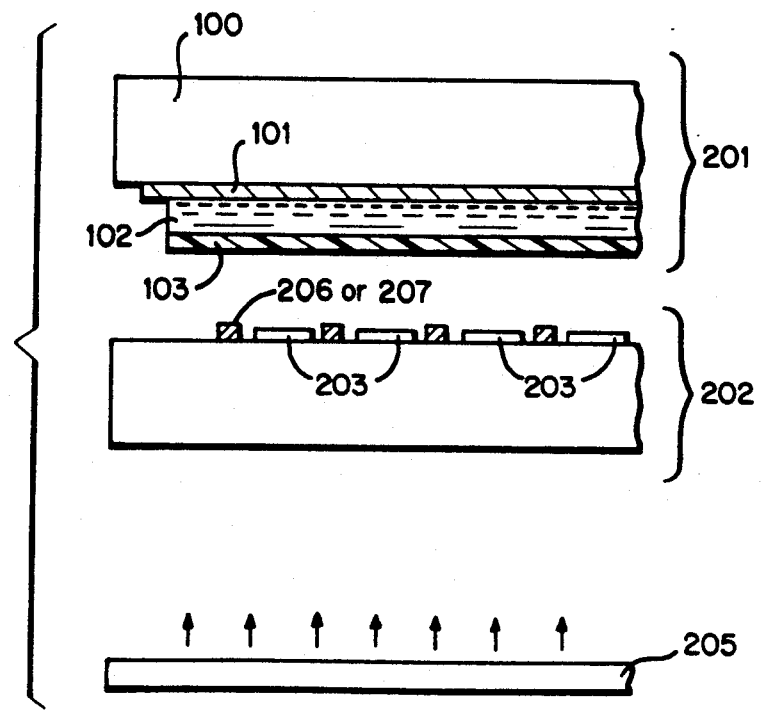
FIG. 4 is a diagrammatic view showing an active matrix substrate inspecting method utilizing a modified version of the active matrix substrate inspecting device of the invention.
Figure 11:
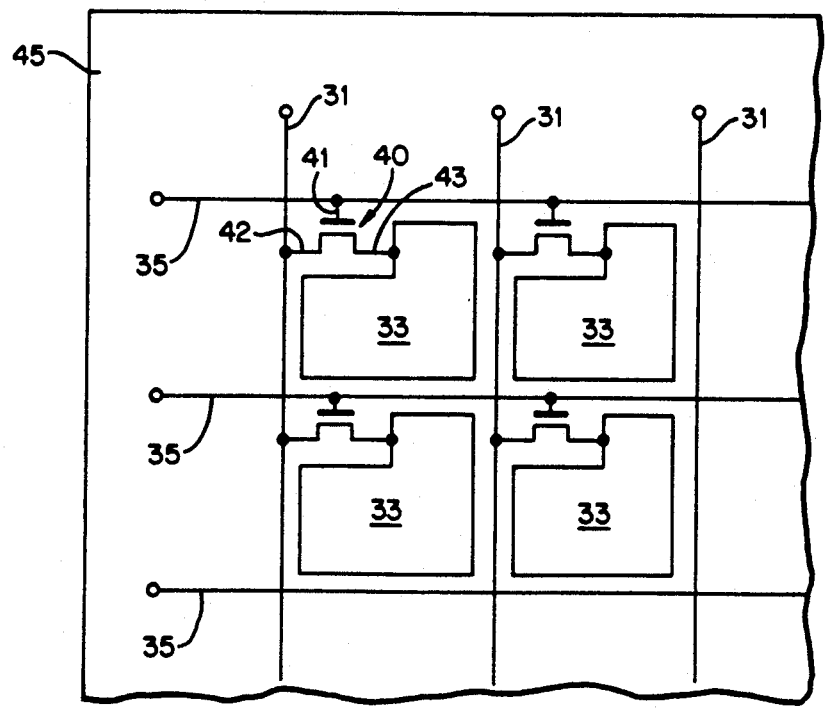
FIG. 11 is an equivalent circuit diagram of the active matrix substrate of the display device of FIG. 10.

The fault inspecting method using the active matrix substrate inspecting device is described below, wherein the active matrix substrate uses a three-terminal element (FIG. 7) formed in the same manner as shown in FIG. 11:

As shown in FIG. 4, the inspecting device 201 is placed with the polymer dispersion liquid crystal layer 102 downward, opposite the pixel electrode 203 formed on the active matrix substrate 202 having no counter substrate, wherein the space between the pixel electrode 203 and the inspecting device 201 is set between 0 $\mu$m to 100 $\mu$m. The light source 205 is provided under and backward of the active matrix substrate 202. This arrangement constitutes the same construction as that of a liquid crystal display device. In this way the transparent conductive film 101 of the active matrix substrate inspecting device 201 functions as the counter electrode of a liquid crystal display device, thereby ensuring that the fault inspection can be performed in the same manner as when the display panels are assembled by applying a simulated as signal voltage as a driving signal to each electrode.

The display inspection is performed by outputting a signal voltage, for example, as shown in FIGS. 3A to 3C, to a scanning line 206 on the active matrix substrate 202 shown in FIG. 7, a signal line 207, and the transparent conductive film 101 of the active matrix substrate inspecting device 201, thereby charging the pixel electrode 203. The electric charge is held in the pixel electrode 203 during the off-state of the thin transistor 208 (FIG. 7). At this time, the potential difference V between the transparent conductive electrode 101 of the active matrix substrate inspecting device 201 and the pixel electrode 203 is distributed among the liquid crystal layer 102, the polymer sheet 103, and the air gaps between the polymer sheet 103 and the pixel electrode 203 of the active matrix substrate 202. In this example, since a polymer disperse-type liquid crystal is employed, the formation of orientation films can be omitted. The potential difference $V_{LC}$ between the opposite ends of the liquid crystal layer 102 is expressed by the following equation (3), where $C_{LC}$, $C_{PS}$ and $C_{AIR}$ are respectively capacitance values between the opposite ends of the liquid crystal layer 102, of the polymer sheet 103, and of the air gaps:

$$V_{LC} = \frac{V}{C_{LC}\left(\frac{1}{C_{PS}} + \frac{1}{C_{AIR}}\right) + 1} \quad (3)$$

This potential difference changes the orientation of liquid crystal molecules in accordance with the potential difference $V_{LC}$. Since the potential difference of the pixel electrode 203 changes in accordance with whether each thin film transistor 208 or each pixel 209 functions or malfunctions. The normal function or abnormal function changes the potential difference V, which changes the potential difference $V_{LC}$. This change modulates the optical characteristic of the active matrix substrate inspecting device 201. The modulation degree is assessed through a visual check or a CCD camera. In this way, each TFT is inspected as to whether it functions normally or not.

For the polymer sheet 103 of the above-mentioned active matrix substrate inspecting device 201, a photoconductive polymer material which becomes a conductive by visual light irradiation can be used; for example, an aromatic heterocyclic compound such as carbazole mixed with polycyclic aromatic hydrocarbon such as anthracene, or a photoconductive base such as arylamine at the side chain or the principal chain of the high-polymer such as polyvinylcarbazol. When these materials are used, a portion irradiated with light from (from below) the back of the active matrix substrate 202; that is a portion of the polymer sheet 103 opposite to the pixel electrode 203 becomes conductive. The potential difference $V_{LC}$ is represented by the following equation:

$$V_{LC} = \frac{V}{C_{LC}/C_{AIR} + 1} \quad (4)$$

An advantage of Example 3 is that the ratio of change of the potential difference $V_{LC}$ to the potential difference V is increased. The sensitiveness of the active matrix substrate inspecting device 201 is advantageously enhanced.

When the size of a display part of the active matrix substrate to be inspected is larger than that of the active matrix substrate inspecting device 20, the inspecting device 20 is moved spot by spot so as to cover the whole inspecting area of display.

When an active matrix substrate using a two-terminal element is inspected, it is preferable that the inspecting device has a transparent conductive film 2 having the same width as the pixel electrode on the active matrix substrate to be inspected and a pattern in the same direction as that of the scanning line. The active matrix substrate is inspected for any fault by applying a simulating signal as a driving signal. In this case, the active matrix substrate can be used with a signal simulating the drive signal used for the actual display.

As is evident from the foregoing description, any faults in the active matrix substrate can be easily inspected by using the inspecting device and inspecting method according to the present invention. If a fault on the active matrix substrate is found, the subsequent production process is stopped, thereby reducing costs by avoiding material wastage.

It is understood that various other modifications will be apparent to and can be readily made by those skilled in the art without departing from the scope and spirit of this invention. Accordingly, it is not intended that the scope of the claims appended hereto be limited to description as set forth herein, but rather that the claims be construed as encompassing all the features of patentable novelty that reside in the present invention, including all features that would be treated as equivalents thereof by those skilled in the art to which this invention pertains.

What is claimed is:

1. An inspection system, comprising:
    an active matrix substrate for use in a liquid crystal display device including:
        an insulating substrate;
        pixel electrodes disposed on said insulating substrate in a matrix; and
        driving elements connected to said pixel electrodes for selectively driving corresponding pixel electrodes;
    an inspection unit detachably coupled to said active matrix substrate including:
        a transparent conductive film formed on a transparent insulating substrate;
        a polymer dispersion-type liquid crystal layer formed on the conductive film; and
        a polymer sheet formed on the liquid crystal layer, said polymer sheet being positioned to inspect said pixel electrodes of said active matrix substrate; and
    means for selectively applying a test voltage across each of said pixel electrodes via said driving elements and said transparent conductive film to detect faults in active matrix substrate.

2. The inspection system according to claim 1, wherein said test voltage applied across said pixel electrodes and said transparent conductive film generates an electric field across said liquid crystal layer to simulate operation of said liquid crystal layer in said liquid crystal display device.

3. The inspection system according to claim 1, wherein an electric field generated by said test voltage visibly changes the orientation of liquid crystal molecules in said liquid crystal layer to permit visual detection of defects in said active matrix substrate.

4. The inspection system according to claim 1, wherein said driving elements are two terminal switching elements.

5. The inspection system according to claim 4, wherein said two terminal elements include back-to-back diodes.

6. The inspection system according to claim 1, wherein said driving elements are three terminal switching elements.

7. The inspection system according to claim 6, wherein said three terminal elements include thin film transistors.

8. The inspection system according to claim 1, wherein said driving elements are selectively enabled by signals received via scanning lines.

9. The inspection system according to claim 1, wherein said test voltage simulates a video display signal.

10. The inspection system according to claim 1, wherein said test voltage (V) creates a potential difference ($V_{LC}$) across said liquid crystal layer according to $$V_{LC} = \frac{V}{[C_{LC}/C_{AIR} + 1]}$$

where $C_{LC}$ is the capacitance of said liquid crystal layer and $C_{AIR}$ is the capacitance of an air gap between said pixel electrodes and said polymer sheet.

11. An active matrix substrate inspecting device according to claim 1, wherein said polymer sheet of said inspection unit is spaced a predetermined distance from said active matrix substrate.

12. An active matrix substrate inspecting device according to claim 11, wherein a distance between said polymer sheet of said inspection unit and the active matrix substrate is less than 100 μm.

13. An active matrix substrate inspecting device according to claim 1, wherein said transparent conductive film is patterned to form scanning lines as active elements.

14. An active matrix substrate inspecting device according to claim 1, wherein said polymer dispersion-type liquid crystal layer is formed using a mixture of UV polymeric compound and liquid crystal solidified by UV light.

15. An active matrix substrate inspecting device according to claim 14, wherein the UV polymeric compound is bifunctional acrylate.

16. An active matrix substrate inspecting device according to claim 1 wherein the thickness of the polymer sheet is within the range from 1.0 μm to 100 μm.

17. An active matrix substrate inspecting device according to claim 1, wherein the polymer sheet is formed by extending a photoconductive high molecular compound comprising a mixture of an aromatic heterocyclic compound and polycyclic aromatic hydrocarbon.

18. An active matrix substrate inspecting device according to claim 17, wherein the aromatic heterocyclic compound is carbazole and the polycyclic aromatic hydrocarbon is anthracene.

19. An active matrix substrate inspecting device according to claim 1, wherein the polymer sheet is formed by extending a photoconductive high molecular compound comprising a mixture of an aromatic heterocyclic compound and photoconductive radical.

20. An active matrix substrate inspecting device according to claim 19, wherein the aromatic heterocyclic compound is carbazole and the polycyclic aromatic hydrocarbon is arilamine.

* * * * *